United States Patent [19]
Kuo

[11] Patent Number: 5,483,184
[45] Date of Patent: Jan. 9, 1996

[54] PROGRAMMABLE CMOS BUS AND TRANSMISSION LINE RECEIVER

[75] Inventor: James R. Kuo, Cupertino, Calif.

[73] Assignee: National Semiconductor Corporation, Santa Clara, Calif.

[21] Appl. No.: 73,927

[22] Filed: Jun. 8, 1993

[51] Int. Cl.⁶ .............................. G06G 7/10; H03F 1/30; H03K 5/153; H03H 17/02
[52] U.S. Cl. .................. 327/83; 327/513; 327/563
[58] Field of Search ................... 375/36, 75; 327/513, 327/512, 83, 77, 543, 535, 538; 330/256–261

[56] References Cited

U.S. PATENT DOCUMENTS

| 3,333,113 | 7/1967 | Cole et al. | 307/88.5 |
| 3,899,754 | 8/1975 | Brolin | 332/11 |
| 4,254,501 | 3/1981 | Griffith et al. | 375/9 |

(List continued on next page.)

FOREIGN PATENT DOCUMENTS

| 0199374 | 10/1986 | European Pat. Off. | H03K 19/094 |
| 0351820A2 | 1/1990 | European Pat. Off. | H03K 19/017 |
| 0504983A1 | 9/1992 | European Pat. Off. | G05F 3/24 |
| 0557080A1 | 8/1993 | European Pat. Off. | H03K 19/003 |
| 0575676A1 | 12/1993 | European Pat. Off. | H03K 19/00 |
| WO85/02507 | 6/1985 | WIPO | H03K 19/092 |
| WO85/04774 | 10/1985 | WIPO | H03K 19/086 |
| WO86/01055 | 2/1986 | WIPO | H03K 19/092 |
| 8900362 | 1/1989 | WIPO | |
| WO91/20129 | 12/1991 | WIPO | H03K 19/003 |

OTHER PUBLICATIONS

Bill Gunning, "GTL Fact Sheet", Sep. 20, 1991, all pages.
Paul R. Gray and Robert G. Meyer, "Analysis and Design of Analog Integrated Circuits", 1977, pp. 254–261.
"Electronically Switchable Interface Circuit With Multiple EIA Protocol Drivers and Receivers", IBM Technical Disclosure Bulletin, vol. 30, No. 11, Apr. 1988, all pages.
Boris Bertolucci, "Fastbus Dual-Port Memory and Display Diagnostic Module", IEEE Transactions on Nuclear Science, vol. NS–34, No. 1, Feb. 1987, pp. 253–257.
National Semiconductor Corporation, "DS36950 Quad Differential Bus Transceiver", Interface Databook, 1990 Edition, pp. 1–123 to 1–131.
National Semiconductor Corporation, "DS3886 BTL 9–Bit Latching Data Transceiver", High Performance Bus Interface Designer's Guide, 1991 Edition, pp. 1–74 to 1–80.
National Semiconductor Corporation, "DS3883 BTL 9–Bit Data Transceiver", High Performance Bus Interface Designer's Guide, 1991 Edition, pp. 1–58 to 1–62.
P. E. Allen and D. R. Holberg, "Analog CMOS Subcircuits: 5.5 Current and Voltage References," *CMOS Analog Circuit Design* (Holt, Rinehart and Winston) (1987) pp. 240–251.
U.S. Serial No. 08/073,939, U.S. Patent Application of James R. Kuo, Jun. 8, 1993.
U.S. Serial No. 08/073,534, U.S. Patent Application of James R. Kuo, Jun. 8, 1993.

(List continued on next page.)

Primary Examiner—Sandra L. O'Shea
Assistant Examiner—John Ning
Attorney, Agent, or Firm—Limbach & Limbach

[57] ABSTRACT

A receiver for providing binary signals from a transmission line to a data system is disclosed. The receiver includes a differential comparator for comparing a reference voltage to an input voltage and for providing a comparator output signal in response to the comparison. The comparator output signal indicates whether the input voltage is greater or less than the reference voltage. A first current source is coupled to the differential comparator for providing current to the differential comparator. The first current source provides substantially the same amount of current to the differential comparator whether the input voltage is greater or less than the reference voltage, and the first current source has a positive temperature coefficient so that when temperature increases the current provided by the first current source increases. A middle stage amplifies the comparator output signal to produce a middle stage output signal and compensates the middle stage output signal for variations in temperature.

19 Claims, 9 Drawing Sheets

U.S. PATENT DOCUMENTS

| | | | |
|---|---|---|---|
| 4,385,394 | 5/1983 | Pace | 375/36 |
| 4,393,494 | 7/1983 | Belforte et al. | 370/27 |
| 4,419,594 | 12/1983 | Gemmell et al. | 307/297 |
| 4,588,941 | 5/1986 | Kerth et al. | 323/314 |
| 4,645,948 | 2/1987 | Morris et al. | 307/296 R |
| 4,647,912 | 3/1987 | Bates et al. | 340/825.5 |
| 4,723,108 | 2/1988 | Murphy et al. | 323/315 |
| 4,751,404 | 6/1988 | Yuen | 307/297 |
| 4,760,292 | 7/1988 | Bach | 307/475 |
| 4,763,021 | 8/1988 | Stickel | 307/475 |
| 4,774,422 | 9/1988 | Donaldson et al. | 307/475 |
| 4,825,402 | 4/1989 | Jalali | 364/900 |
| 4,855,622 | 8/1989 | Johnson | 307/456 |
| 4,855,623 | 8/1989 | Flaherty | 307/475 |
| 4,894,561 | 1/1990 | Nogami | 307/443 |
| 4,922,140 | 5/1990 | Gahle et al. | 307/591 |
| 4,929,941 | 5/1990 | Lecocq | 340/825.14 |
| 4,972,106 | 11/1990 | Ruijs | 307/473 |
| 4,978,905 | 12/1990 | Hoff et al. | 323/314 |
| 4,980,579 | 12/1990 | McDonald et al. | 307/455 |
| 5,015,888 | 5/1991 | Ovens | 307/475 |
| 5,017,813 | 5/1991 | Galbraith et al. | 307/475 |
| 5,019,728 | 5/1991 | Sanwo et al. | 307/475 |
| 5,021,684 | 6/1991 | Ahuja et al. | 307/443 |
| 5,021,691 | 6/1991 | Saito | 307/475 |
| 5,023,487 | 6/1991 | Wellheuser et al. | 307/475 |
| 5,023,488 | 6/1991 | Gunning | 307/475 |
| 5,034,632 | 7/1991 | Jansson et al. | 307/456 |
| 5,041,743 | 8/1991 | Matsumoto | 307/455 |
| 5,070,256 | 12/1991 | Grondalski | 307/270 |
| 5,079,456 | 1/1992 | Kotowski et al. | 307/571 |
| 5,081,380 | 1/1992 | Chen | 307/591 |
| 5,095,231 | 3/1992 | Sartori et al. | 307/475 |
| 5,117,130 | 5/1992 | Shoji | 307/443 |
| 5,118,971 | 6/1992 | Schenck | 307/443 |
| 5,165,046 | 11/1992 | Hesson | 307/270 |
| 5,198,701 | 3/1993 | Davies et al. | 307/296.3 |
| 5,200,654 | 4/1993 | Archer | 307/491 |
| 5,208,492 | 5/1993 | Masumoto et al. | 307/469 |
| 5,216,292 | 6/1993 | Imazu et al. | 307/443 |
| 5,218,239 | 6/1993 | Boomer | 307/443 |
| 5,231,315 | 7/1993 | Thelen, Jr. | 307/491 |
| 5,231,316 | 7/1993 | Thelen, Jr. | 307/491 |
| 5,241,221 | 8/1993 | Fletcher et al. | 307/263 |
| 5,254,883 | 10/1993 | Horowitz et al. | 307/443 |
| 5,285,116 | 2/1994 | Thaik | 307/443 |
| 5,287,386 | 2/1994 | Wade | 375/36 |
| 5,291,071 | 3/1994 | Allen et al. | 307/270 |
| 5,293,082 | 3/1994 | Bathaee | 307/270 |
| 5,296,756 | 3/1994 | Patel et al. | 307/443 |
| 5,304,861 | 4/1994 | Fruhauf et al. | 307/296.4 |
| 5,313,118 | 5/1994 | Lundberg | 307/451 |
| 5,315,174 | 5/1994 | Chang et al. | 307/443 |
| 5,319,258 | 6/1994 | Ruetz | 307/443 |
| 5,329,184 | 7/1994 | Redfern | 307/475 |
| 5,334,882 | 8/1994 | Ting | 307/270 |
| 5,338,987 | 8/1994 | Tomasetti et al. | 307/570 |
| 5,357,149 | 10/1994 | Kimura | 307/310 |
| 5,386,160 | 1/1995 | Archer | 327/513 |

OTHER PUBLICATIONS

U.S. Serial No. 08/073,679, U.S. Patent Application of James R. Kuo, Jun. 8, 1993.

U.S. Serial No. 08/073,304, U.S Patent Application of James R. Kuo, Jun. 8, 1993.

U.S. Serial No. 08/146,617, U.S. Patent Application of James R. Kuo, Nov. 2, 1993.

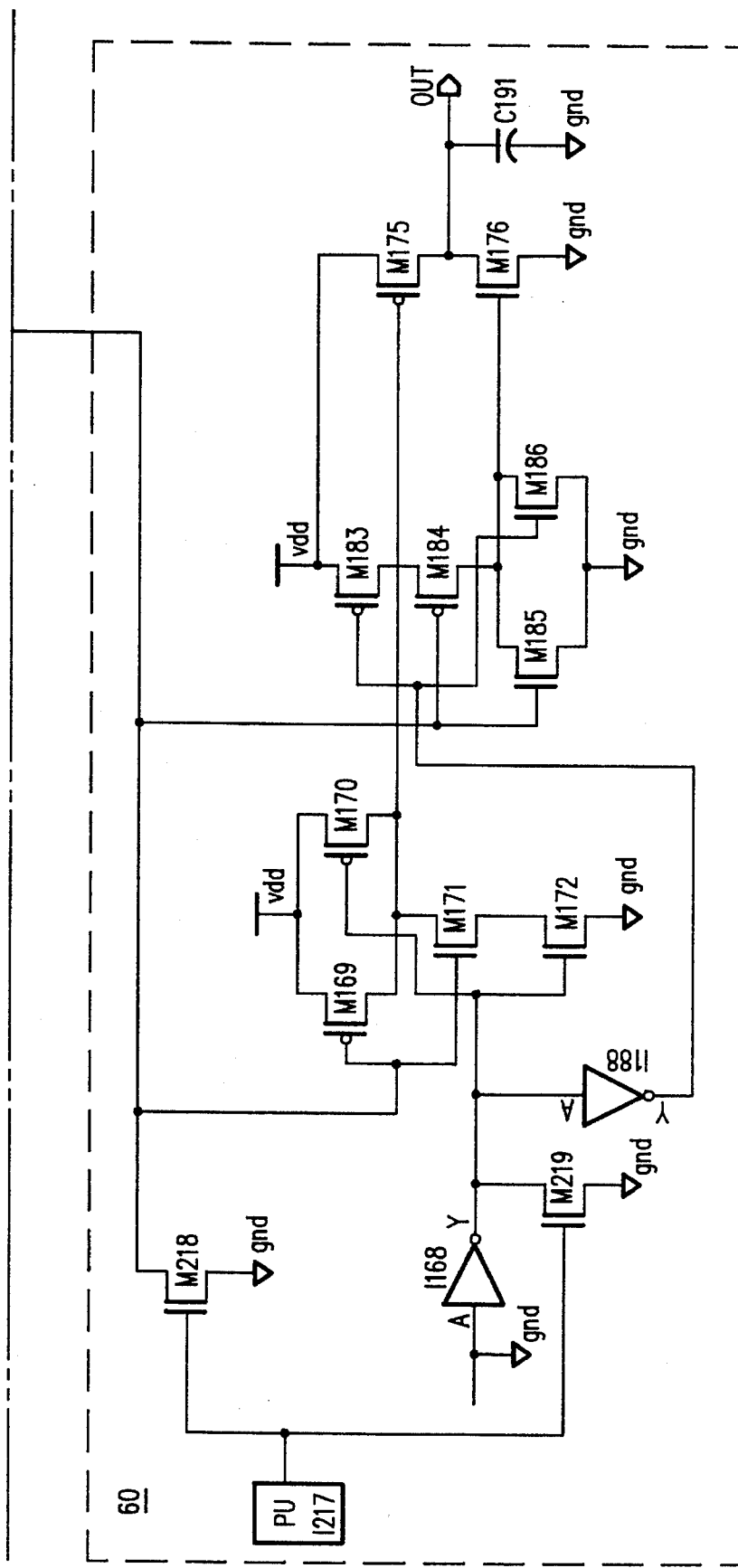
FIG. 7B
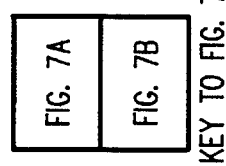
KEY TO FIG. 7

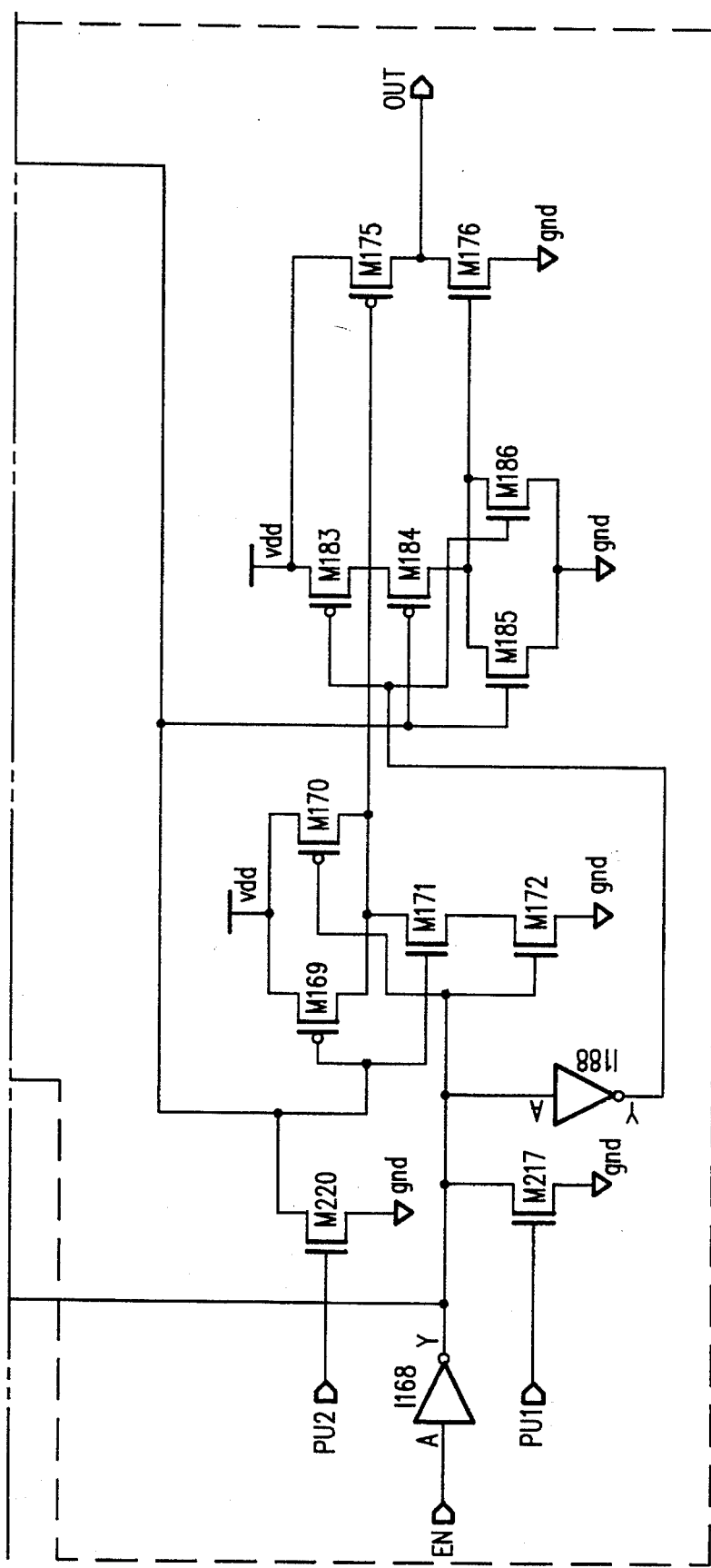
FIG. 8B
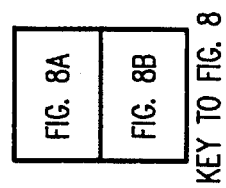
KEY TO FIG. 8

PROGRAMMABLE CMOS BUS AND TRANSMISSION LINE RECEIVER

RELATED APPLICATIONS

This application is related to the following copending applications that were all filed of even date herewith and are commonly assigned with this application to National Semiconductor Corporation of Santa Clara, Calif.: U.S. Ser. No. 08/073,939 titled "Programmable CMOS Current Source Having Positive Temperature Coefficient" by James Kuo; U.S. Ser. No. 08/073,534 titled "CMOS BTL Compatible Bus and Transmission Line Driver" by James Kuo; U.S. Ser. No. 08/073,304 titled "CMOS Bus and Transmission Line Driver Having Compensated Edge Rate Control" by James Kuo; and, U.S. Ser. No. 08/073,679 titled "Programmable Slew Rate CMOS Buffer and Transmission Line Driver with Temperature Compensation" by James Kuo. The above-referenced applications are hereby incorporated by reference to provide background information regarding the present invention.

BACKGROUND OF THE INVENTION

1. Field of the Invention

The present invention relates to line interface devices, and, in particular, to a CMOS bus and transmission line receiver that is used for interfacing CMOS digital circuits to transmission lines.

2. Description of the Related Art

Digital systems typically include several Very Large Scale Integrated (VLSI) circuits that cooperate and communicate with one-another to perform a desired task. FIG. 1 illustrates a typical digital system. The VLSI circuits are mounted on several circuit boards that are referred to as "daughter boards". Each daughter board may accommodate several VLSI circuits. In turn, the daughter boards are received by a "mother board" that has circuitry for facilitating communication between the individual daughter boards.

The individual VLSI circuits are interconnected for binary communication by transmission mediums. The transmission mediums are generally collected together to form buses. The number, size and types of buses that are used in a digital system may be designed for general-purpose applications or according to a more specific, industry standard data-communications configuration. One such industry standard is the so-called IEEE 896.1 Futurebus+ standard. The Futurebus+ standard provides a protocol for implementing an internal computer bus architecture.

FIG. 1 illustrates the hierarchy of the several different bus levels utilizable in a Futurebus+ system. A "component level bus" is used to interconnect the several VLSI circuits that are located on a single daughter board, and a "backplane bus" is used to interconnect the VLSI circuits of one daughter board to the VLSI circuits of another daughter board. Thus, a component level bus is constructed on each daughter board, and a backplane bus is constructed on the mother board.

The transmission mediums which form the component and backplane buses are typically traces which are formed on the printed circuit board (PCB) substrates of the daughter and mother boards. Microstrip traces and strip line traces can be employed to form transmission lines having characteristic impedances on the order of about 50 $\Omega$–70 $\Omega$. Such transmission lines usually have their opposite ends terminated in their characteristic impedance. Because of the parallel resistive terminations, the effective resistance of the transmission line may be as low as 25 $\Omega$–35 $\Omega$.

Data transceivers (TRANSmitter/reCEIVER) are used to interface the VLSI circuits to the transmission medium. FIG. 2 illustrates the positioning of a data transceiver between the backplane bus of a Futurebus+ system and the data bus of a VLSI circuit to facilitate communications between the VLSI circuit and the rest of the digital system.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver changes the nominal voltage swing (or the "dynamic signal range") utilized by the VLSI circuitry, e.g., CMOS, TTL, ECL, etc., to a different voltage swing that is utilized by the transmission medium. Thus, a driver not only amplifies a digital signal, but it changes the nominal voltage swing of the signal as well. Conventional receivers receive signals from the transmission medium and change the nominal voltage swing back to that utilized by the VLSI circuitry.

CMOS technology is attractive for implementing VLSI circuits with high density and with much lower power dissipation than its bipolar counterpart. However, standard TTL or CMOS circuits operate between 5 Volts and ground which causes them to dissipate excessive amounts of power when driving terminated transmission lines. ECL has been used for many years to drive terminated transmission lines; however, ECL has relatively high power dissipation.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

It has become common for signals to be transmitted over transmission lines at BTL (Backplane Transceiver Logic) signal levels. The signal level standard is denoted "Backplane" because BTL has been used primarily in the backplane buses of mother boards. Because the nominal voltage swing of BTL is 1.0 Volt (logic low) to 2.1 Volts (logic high), power dissipation is less than it would be if the signals were transmitted over the transmission lines at CMOS (0 Volts to 3.3 Volts, or, 0 Volts to 5.0 Volts) or TTL (0 Volts to 3.5 Volts) signal levels.

Signals have also been transmitted over transmission lines at the so-called "GTL" signal levels disclosed in U.S. Pat. No. 5,023,488 to Gunning ("Gunning"). Gunning discloses such GTL drivers and receivers for interfacing VLSI CMOS circuits to transmission lines. The nominal voltage swing of GTL is 0.3 Volts (logic low) to 1.2 Volts (logic high).

FIG. 3 shows a basic GTL receiver 10. The front end of the receiver 10 is basically a CMOS differential comparator 12. The comparator 12 includes two p-channel transistors M1 and M2 that have their sources coupled together and their drains coupled to the drains of two n-channel transistors M5 and M4, respectively. Transistors M5 and M4 have their gates coupled together and their sources coupled to voltage supply $V_{SS}$. For the present analysis, it will be assumed that $V_{SS}$ is equal to ground potential. The drain of transistor M4 is coupled to its gate.

A p-channel current source transistor M3 is coupled between voltage supply $V_{DD}$ and the sources of transistors M1 and M2. The purpose of transistor M3 is to feed current to the differential comparator 12. The voltage signals that are compared by the comparator 12 are a reference voltage $V_{REF}$ and the voltage present on the terminated transmission line $V_{IN}$. $V_{REF}$ is coupled to the gate of transistor M2, and $V_{IN}$ is coupled to the gate of transistor M1. Furthermore, $V_{IN}$ is coupled to the gate of the current source transistor M3. $V_{REF}$ is set at approximately 0.8 Volts, the midpoint of the GTL voltage swing.

When $V_{IN}$ is "low", i.e., approximately equal to 0.3 Volts, transistors M3 and M1 both conduct current from source to drain. Transistor M2 is not conducting because its gate voltage is higher than the gate voltage of transistor M1; in other words, because transistor M1 is turned on harder, current will flow towards transistor M1 rather than transistor M2. Because transistors M3 and M1 are conducting, the drain of transistor M5 is pulled high. The high signal level at the drain of transistor M5 is amplified by two inverters 14 and 16 to produce the output $V_{OUT}$.

When $V_{IN}$ switches to "high", i.e., approximately equal to 1.2 Volts, transistor M3 continues to conduct current from source to drain because $V_{DD}$ is equal to 3.3 Volts, i.e., the $V_{SG}$ of transistor M3 is greater than its threshold voltage $V_{TH}$. Transistor M1, however, stops conducting current and transistor M2 starts conducting current because the gate voltage of transistor M2 is now lower than the gate voltage of transistor M1. Diode connected transistor M4 conducts current from drain to source which causes transistor M5 to conduct current from drain to source because transistors M4 and M5 form a current mirror. Because transistor M5 is conducting, its drain is pulled low. The low signal level at the drain of transistor M5 is amplified by inverters 14 and 16 to produce the output $V_{OUT}$.

The GTL receiver 10 suffers from a number of disadvantages. First, the receiver 10 has poor AC common mode rejection; i.e., the data pulse skew tends to vary with common mode level. Specifically, the charging and discharging currents to the inverter 14 are different due to the connection of $V_{IN}$ to the gate of transistor M3. In other words, the amount of current conducted by transistor M3 is different when $V_{IN}$ is high than when $V_{IN}$ is low because transistor M3 is turned on harder when $V_{IN}$ is low (i.e., $V_{SGM3}$ is larger when $V_{IN}$ is low). Thus, the amount of current conducted to the drain of transistor M5 when $V_{IN}$ is low is greater than the amount of current conducted from the drain of transistor M5 when $V_{IN}$ is high. This causes the input of inverter 14 to go high faster than it goes low because the charging current is greater than the discharging current, resulting in $V_{OUT}$ having a greater propagation delay from high to low than from low to high which increases the skew of the receiver 10.

Second, the current conducted by current source transistor M3, as well as the inverters 14 and 16, are both temperature and supply voltage $V_{DD}$ dependent. This causes the propagation delay of the receiver 10 to be sensitive to temperature and supply voltage variations. Specifically, when temperature increases, the current conducted by transistor M3 decreases which increases the transition time of the voltage level at the drain of transistor M5. The increased transition time increases the propagation delay of the receiver 10. On the other hand, when temperature decreases, the current conducted by transistor M3 increases which decreases the propagation delay. When the voltage supply $V_{DD}$ decreases, current decreases which increases the propagation delay, and when the voltage supply $V_{DD}$ increases, current increases which decreases the propagation delay.

Third, temperature variations also cause poor pulse fidelity, and the inverters 14 and 16 are not enough to improve the pulse fidelity. The input sensitivity of the receiver 10 also degrades with variations in temperature due to the current variations.

Thus, there is a need for a transmission line receiver that overcomes the disadvantages of the prior art GTL receiver 10.

SUMMARY OF THE INVENTION

The present invention provides a receiver for providing binary signals from a transmission line to a data system. The receiver includes a differential comparator for comparing a reference voltage to an input voltage and for providing a comparator output signal in response to the comparison. The comparator output signal indicates whether the input voltage is greater or less than the reference voltage. In addition, a first current source is coupled to the differential comparator for providing current to the differential comparator. The first current source provides substantially the same amount of current to the differential comparator whether the input voltage is greater or less than the reference voltage, and the first current source has a positive temperature coefficient so that when temperature increases the current provided by the first current source increases.

An alternative embodiment of the present invention provides a receiver for providing binary signals from a transmission line to a data system. The receiver includes a differential comparator and a middle stage. The middle stage amplifies the comparator output signal to produce a middle stage output signal and compensates the middle stage output signal for variations in temperature.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 1:
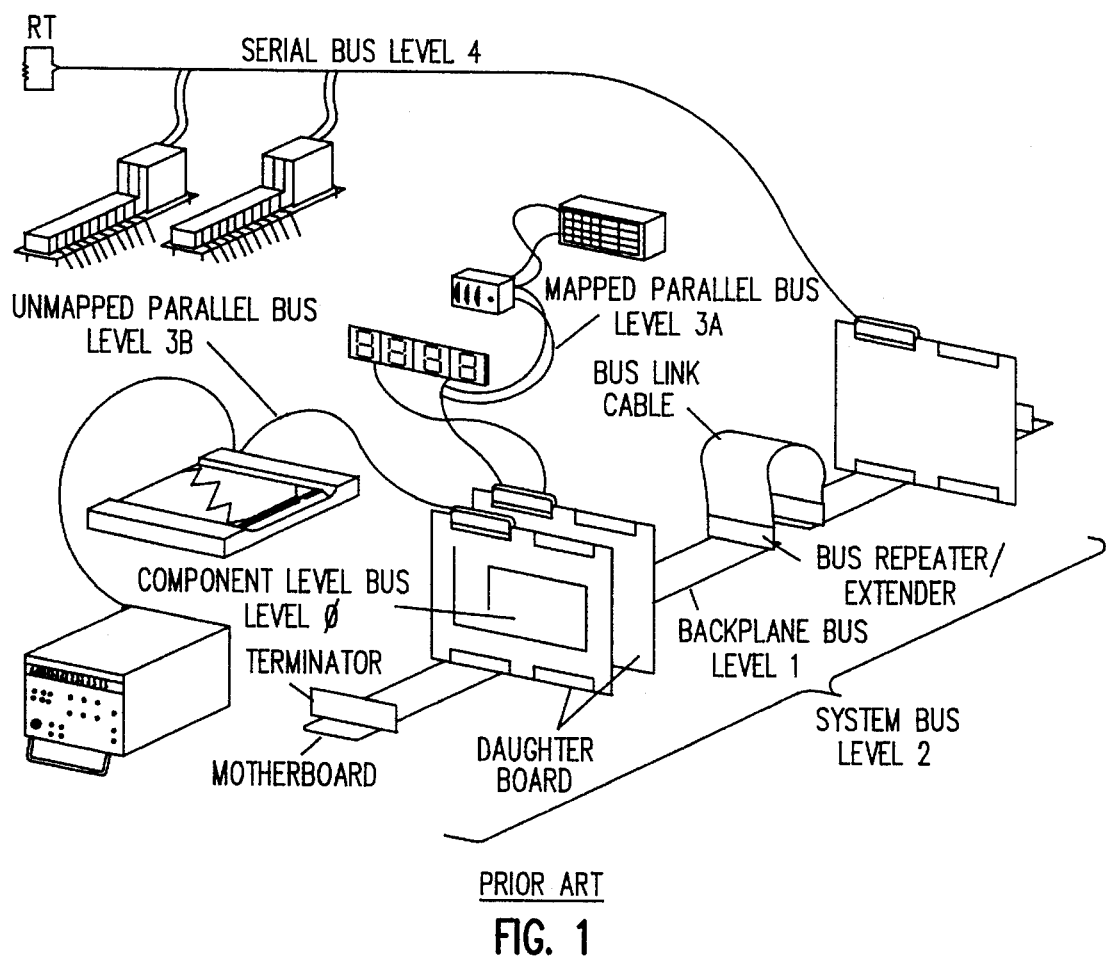
FIG. 1 is a pictorial illustration of the hierarchy of bus levels in a Futurebus+ system.
Figure 2:
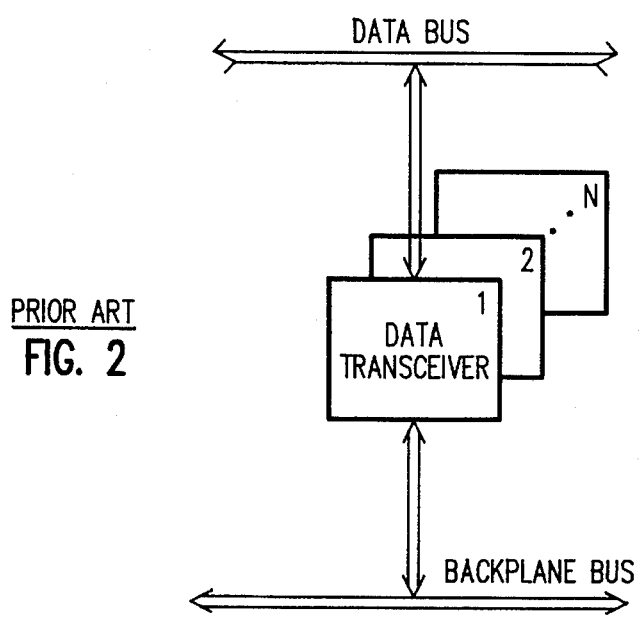
FIG. 2 is a block diagram illustrating the placement of a data transceiver between the backplane bus of a Futurebus+ system and the data bus of a processor in the Futurebus+ system.
Figure 3:
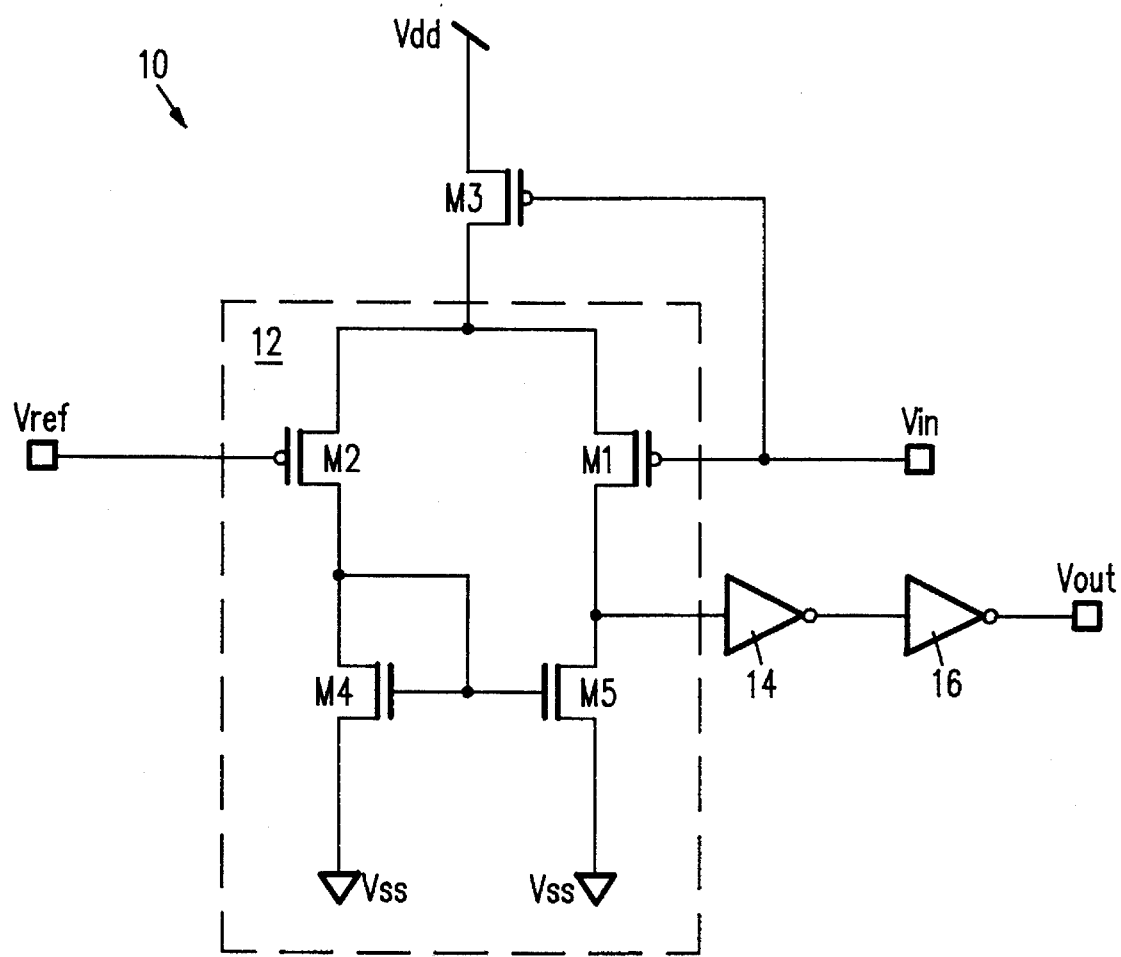
FIG. 3 is a schematic diagram illustrating a prior art GTL transmission line receiver.
Figure 4:
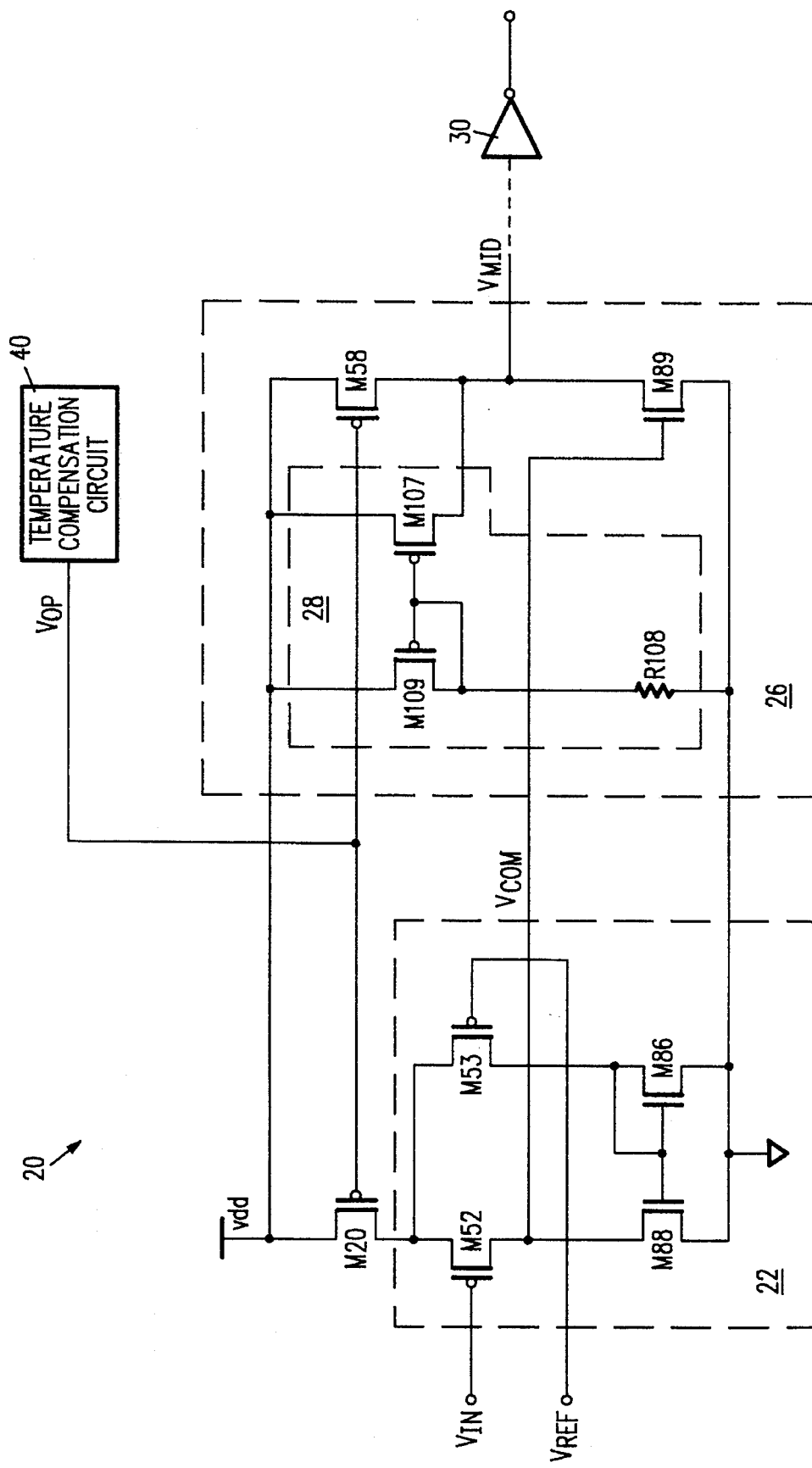
FIG. 4 is a schematic diagram illustrating a CMOS transmission line receiver in accordance with the present invention.

FIG. 4 shows a CMOS transmission line receiver 20 in accordance with the present invention. The receiver 20 may be coupled to a transmission line at input $V_{IN}$ and provide received signals to a CMOS circuit at output $V_{OUT}$. The output $V_{OUT}$ operates within the CMOS dynamic signal range; i.e., logic low=0 Volts and logic high=3.3 Volts. The receiver 20 may be programmed to receive at input $V_{IN}$ either BTL or the so-called "GTL" level signals. BTL level signals generally have a voltage swing of 1.0 Volt (logic low) to 2.1 Volts (logic high), and GTL level signals generally have a voltage swing of 0.3 Volts± 0.1 Volt (logic low) to 1.2 Volts±5% (logic high). The receiver 20 is programmed by setting $V_{REF}$ approximately equal to 1.55 Volts for BTL or 0.8 Volts for GTL. Whether the receiver 20 is programmed to receive BTL or GTL level signals, it will generate CMOS level signals at output $V_{OUT}$.

The receiver 20 may be operated at a data rate up to 250 MHz or higher, depending upon the process technology. Its propagation delay is relatively insensitive to temperature and voltage supply $V_{DD}$ variations, and good pulse fidelity is also achieved during temperature variations. The data pulse skew is less than 250 pico-seconds over the common mode range, and the input sensitivity remains relatively constant with temperature and voltage supply variations.

Normally, the receiver 20 is coupled to a relatively low impedance transmission line which is terminated to voltage levels $V_T$. $V_T$ is on the order of about 2.1 Volts when the receiver 20 is programmed to receive BTL level signals or on the order of about 1.2 Volts when the receiver 20 is programmed to receive GTL level signals. The transmission line is typically a microstrip trace or a strip line trace with a characteristic impedance on the order of about 50 Ω–70 Ω. Normally, the transmission line has its opposite ends terminated in its characteristic impedance. The effective resistance of the parallel terminating resistors is normally 25 Ω–35 Ω.

The receiver 20 includes a CMOS differential comparator 22, a current source p-channel transistor M20, a temperature compensation circuit 40, and a middle stage 26.

The CMOS differential comparator 22 compares the reference voltage $V_{REF}$ to the input voltage $V_{IN}$ and provides a comparator output signal $V_{COM}$ in response to the comparison. $V_{COM}$ indicates whether $V_{IN}$ is greater than or less than $V_{REF}$.

The differential comparator 22 includes two p-channel transistors M52 and M53 that have their sources coupled together. Two n-channel transistors M88 and M86 have their gates and sources coupled together and their drains coupled respectively to the drains of transistors M52 and M53. The drain of transistor M86 is coupled to its gate. The gate of transistor M52 receives $V_{IN}$, the gate of transistor M53 receives $V_{REF}$, and the drain of transistor M88 provides $V_{COM}$.

The basic operation of the differential comparator 22 is similar to the operation of the differential comparator 12 of the prior art receiver 10 discussed above. For example, if GTL level signals are to be received at $V_{IN}$, then $V_{REF}$ is set to approximately 0.8 Volts, the midpoint of the GTL voltage swing. When $V_{IN}$ is low, i.e., $V_{IN} \approx 0.3$ Volts, current is conducted by transistor M52 which pulls $V_{COM}$ high. On the other hand, when $V_{IN}$ is high, i.e., $V_{IN} \approx 1.2$ Volts, current is conducted by transistor M53 which pulls $V_{COM}$ low. If BTL level signals are to be received at $V_{IN}$, then $V_{REF}$ is set to approximately 1.55 Volts, and the operation of the differential comparator 22 is otherwise the same.

Although the basic operation of the differential comparator 22 is similar to the differential comparator 12 discussed above, the performance of the differential comparator 22 is greatly improved by the use of the current source transistor M20 and the temperature compensation circuit 40. The combination of transistor M20 and the temperature compensation circuit 40 form a current source for providing current to the differential comparator 22.

Specifically, the p-channel transistor M20 has its source coupled to voltage supply $V_{DD}$ and its drain coupled to the source of transistor M52 of the differential comparator 22. The gate of transistor M20 is coupled to an output $V_{OP}$ of the temperature compensation circuit 40. The temperature compensation circuit adjusts the gate voltage of transistor M20, via output $V_{OP}$, to provide current to the differential comparator 22 and to adjust the level of that current to compensate for variations in temperature. The temperature compensation circuit 40 causes the propagation delay of the receiver 20 to be relatively insensitive to temperature variations, supply voltage $V_{DD}$ variations, and process variations.

The effects of temperature variation on MOSFET transistors, as well as the structure and operation of the temperature compensation circuit 40, will be described in detail below with reference to FIG. 5. As will be seen, however, the primary component of the temperature compensation circuit 40 is a positive temperature coefficient current generation circuit 42 (see FIG. 5) which causes the current conducted by transistor M20 to increase when temperature increases. For the present discussion regarding the basic operation of the receiver 20, however, it can be assumed that output $V_{OP}$ maintains a source-gate potential $V_{SG}$ on transistor M20 such that it will conduct a steady current to the sources of transistors M52 and M53 of the differential comparator 22.

In the prior art receiver 10, transistor M3 provides current to the differential comparator 12. Transistor M3 is controlled by $V_{IN}$ which causes it to provide a higher charging current when $V_{IN}$ is low than the discharging current when $V_{IN}$ is high. This causes the receiver 10 to have poor skew. On the other hand, the current source formed by transistor M20 and the temperature compensation circuit 40 provide substantially the same amount of current to the differential comparator 22 whether $V_{IN}$ is greater than or less than $V_{REF}$ because transistor M20 is not controlled by $V_{IN}$. This symmetrical current provided to the differential comparator causes the receiver 20 to have very good skew. Furthermore, the positive temperature coefficient current generation circuit of the temperature compensation circuit 40 cause the current provided to the differential comparator 22 to be compensated for variations in temperature.

In the embodiment shown in FIG. 4, transistor M20 has a channel width=160 μm and a channel length=1 μm. Furthermore, transistors M52 and M53 have channel widths=100 μm and channel lengths=1 μm, and transistors M86 and M88 have channel widths=26 μm and channel lengths=1 μm. It should be understood that these are only preferred channel sizes and that they may be varied to suit the needs of a particular application.

The middle stage 26 amplifies the comparator output signal $V_{COM}$ to produce a middle stage output signal $V_{MID}$ and to compensate $V_{MID}$ for variations in temperature. The middle stage 26 includes an n-channel transistor M89, a p-channel current source transistor M58, and a negative temperature coefficient current source 28.

Transistor M89 receives $V_{COM}$ at its gate, has its source coupled to the sources of transistors M86 and M88, and produces $V_{MID}$ at its drain. The drain of transistor M89 is coupled to the drain of p-channel current source transistor M58. Transistor M58, along with temperature compensation circuit 40, form a positive temperature coefficient current source for providing current to a circuit, such as an inverter 30, that may be coupled to $V_{MID}$ and to compensate that current for variations in temperature. Transistor M58 has its source coupled to $V_{DD}$ and its drain coupled to the drain of transistor M89. The gate voltage of transistor M58 is adjusted by output $V_{OP}$ of the temperature compensation circuit 40.

The negative temperature coefficient current source 28 provides current to a circuit, such as inverter 30, that may be coupled to $V_{MID}$. The effects of temperature variations on MOSFET transistors will be described in detail below with reference to FIG. 5. For the present discussion, however, it should be assumed that a positive temperature coefficient current source increases current when temperature increases and decreases current when temperature decreases, and that a negative temperature coefficient current source decreases current when temperature increases and increases current when temperature decreases.

The current source 28 includes a p-channel transistor M107 and biasing circuitry that includes a p-channel transistor M109 and a resistor R108. Transistor M107 has its source coupled to $V_{DD}$ and its drain coupled to the drain of transistor M58. The biasing circuitry applies a voltage between the source and gate of transistor M107 which causes its channel to conduct the current having a negative temperature coefficient. Transistor M109 has its source coupled to $V_{DD}$ and its gate coupled to its drain and the gate of transistor M107. The resistor R108 is coupled between the drain of transistor M109 and a node that is common with the sources of transistors M89, M86, and M88.

During operation, when $V_{COM}$ is high, transistor M89 conducts current from drain to source which pulls $V_{MID}$ low. When $V_{MID}$ is low, a discharging current is conducted by transistor M89 from inverter 30 to ground. The current that is conducted by transistor M89 is provided with some temperature compensation because the current provided to the gate of transistor M89 via $V_{COM}$ is generated by transistor M20. As explained above, transistor M20 provides a current having a positive temperature coefficient. Thus, $V_{COM}$, which controls the discharging current conducted by the channel of transistor M89, is compensated for variations in temperature.

When $V_{COM}$ switches to low, i.e., ≈ground, the gate of transistor M89 is pulled low which causes transistor M89 to cut off. $V_{MID}$ is then pulled high by transistor M58 and a charging current is conducted by the channel of transistor M58 to inverter 30.

Therefore, transistor M58 provides a charging current to inverter 30 via $V_{MID}$, and transistor M89 provides a discharging current from inverter 30 via $V_{MID}$. The charging current generated by transistor M58 is directly compensated for temperature variations because the gate of transistor M58 is coupled to $V_{OP}$. However, the discharging current generated by transistor M89 is only indirectly compensated for temperature variations because the gate of transistor M89 is controlled by transistor M20. Both transistors M20 and M58 generate currents having positive temperature coefficients. Thus, the charging current provided to inverter 30 by transistor M58 has a positive temperature coefficient, and the discharging current from inverter 20 provided by transistor M89 also has a positive temperature coefficient because transistor M89 is controlled by transistor M20. Because the discharging current generated by transistor M89 is only indirectly compensated for temperature variations, its positive temperature coefficient effect on inverter 30 is attenuated some-what from that of the charging current provided by transistor M58. Therefore, the charging current conducted by transistor M58 to inverter 30 when $V_{COM}$ is low has more positive temperature coefficient compensation effect than the discharging current conducted from inverter 30 by transistor M89 when $V_{COM}$ is high.

In the absence of the negative temperature compensation current source 28, the lack of temperature compensation symmetry between the currents conducted by transistors M58 and M89 will degrade the skew of the receiver 20. The purpose of the negative temperature compensation current source 28 is to correct this lack of temperature compensation symmetry. Specifically, the negative temperature coefficient current provided by transistor M107 tends to attenuate the positive temperature coefficient effects of the charging current provided by transistor M58 in a manner similar to the attenuation provided by transistor M89 on the current provided by transistor M20. Because the charging (sourcing) current and the discharging (sinking) current have nearly the same temperature coefficient, $V_{MID}$ maintains nearly zero skew between its rising and falling edge even during temperature variations.

Transistor M107 provides a relatively steady current to inverter 30 because transistor M109 provides a relatively steady source-gate voltage $V_{SG}$ to transistor M107. Specifically, transistor M109 is diode connected which causes it to conduct a relatively steady current through resistor R108. Transistors M109 and M107 form a current mirror which means that they conduct equal currents because their source-gate voltages $V_{SG}$ are equal.

Thus, the middle stage 26 improves the performance of the receiver 20 by amplifying $V_{COM}$ to produce $V_{MID}$ and by providing temperature compensation to $V_{MID}$ that is substantially the same for both the charging and discharging states. Furthermore, the middle stage 26 provides additional wave shaping of $V_{COM}$.

In the embodiment shown in FIG. 4, transistor M58 has a channel width=50 μm and a channel length=1 μm, and transistor M89 has a channel width=40 μm and a channel length=1 μm. Furthermore, transistors M107 has a channel width= 80 μm and channel lengths=1 μm, and transistors M109 has a channel width=10 μm and channel lengths=1 μm. Resistor R108 has a value of 15 KΩ. It should be understood that these are only preferred channel sizes and resistances and that they may be varied to suit the needs of a particular application.

The temperature compensation circuit 40, along with transistors M20 and M58, causes the propagation delay of the receiver 20 to be relatively insensitive to temperature variations, supply voltage variations, and process variations. The prior art receiver 10 discussed above has no such temperature compensation scheme.

Temperature variations affect the performance of FETs. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

FET performance is affected because temperature variations tend to cause the transconductance $g_m$ of the transistors to vary. The amount of current that is conducted by a transistor's current conducting channel, i.e., the current conducted between the drain and source ($I_{DS}$ for n-channel and $I_{SD}$ for p-channel), is determined in part by $g_m$. In the case of a MOSFET, when temperature increases, transconductance $g_m$ decreases which causes currents $I_{DS}$ and $I_{SD}$ to decrease. On the other hand, when temperature decreases, transconductance $g_m$ increases which causes $I_{DS}$ and $I_{SD}$ to increase. Thus, it may be said that the current conducted by the channel of a MOSFET has a negative temperature coefficient. Furthermore, $I_{DS}$, $I_{SD}$, and $g_m$ vary linearly with temperature variations.

Logic gates, such as the receiver 20, are typically constructed from several transistors. The speed of a logic gate is determined in part by the $I_{DS}$ of the individual transistors, which results in gate speed being proportional to $g_m$. If the $g_m$ of each transistor in a logic gate varies with temperature, then the $I_{DS}$ of each transistor also varies which causes the speed of the logic gate to vary with temperature. For example, when temperature increases, gate speed decreases, and when temperature decreases, gate speed increases.

Variations in gate speed due to temperature variations is an undesirable characteristic because such variations can adversely affect the synchronized timing operations of a digital system. Digital systems can be designed to operate more efficiently if the designer can be assured that gate speed will remain constant. Gate speed can be kept relatively constant if temperature is kept constant. However, because digital systems must operate in a variety of environments, ambient and junction temperature cannot always be controlled. A relatively constant logic gate speed can be maintained during temperature variations if the current conducted by the conducting channels of a logic gate's MOSFET transistors is maintained at relatively constant levels despite the temperature variations.

Figure 5:
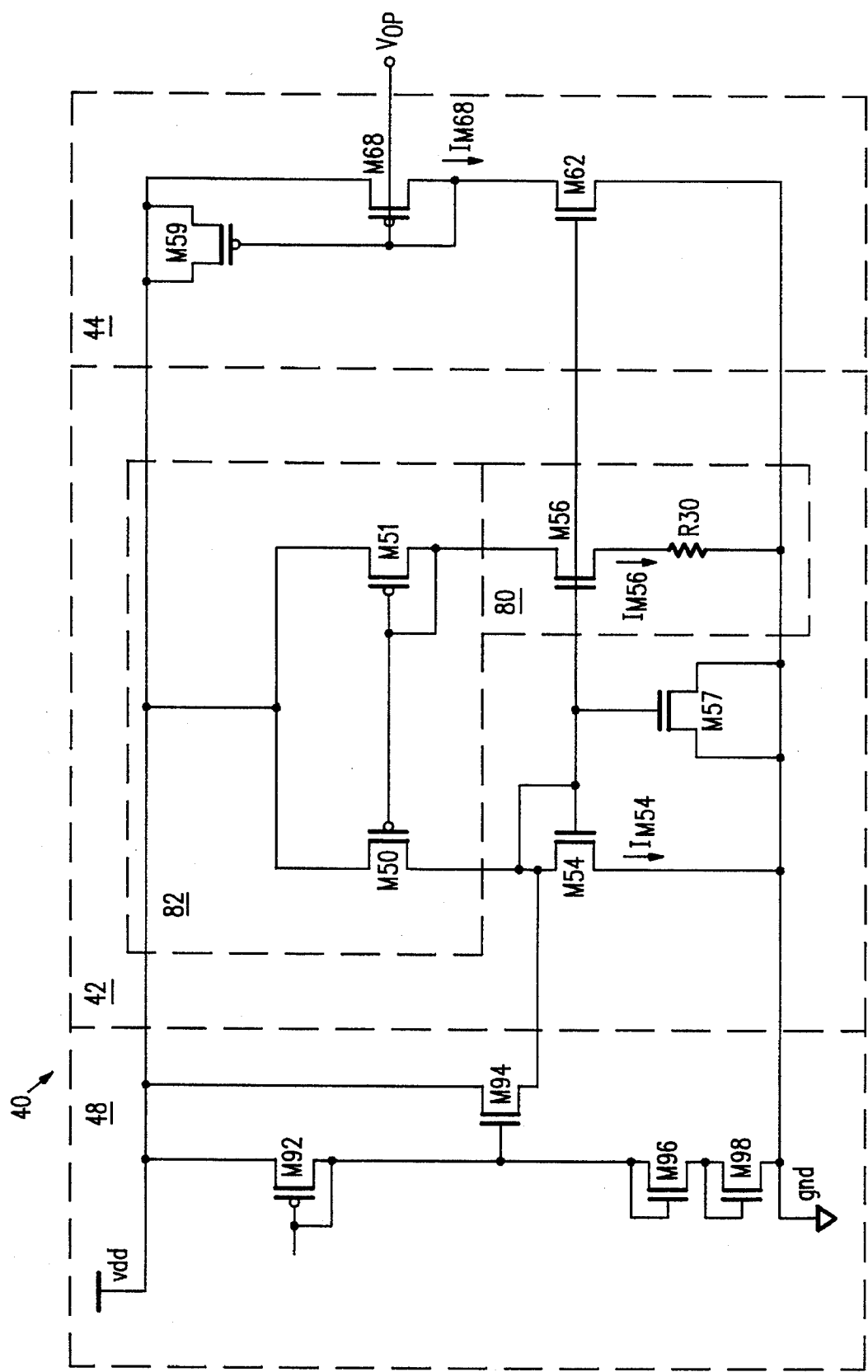
FIG. 5 is a schematic diagram illustrating a CMOS temperature compensation circuit that may be used with the transmission line receiver shown in FIG. 4.

FIG. 5 shows the detailed structure of the CMOS temperature compensation circuit 40. The circuit 40 is capable of adjusting the source-drain current $I_{SD}$ generated by transistors M20 and M58, respectively, to compensate for temperature variations.

In general, the circuit 40 adjusts the $I_{SD}$ generated by transistor M20 (as well as transistor M58) to compensate for variations in temperature by adjusting its gate voltage in response to the temperature variations. Because transistor M20 is a p-channel MOSFET, when temperature increases, the circuit 40 adjusts the gate voltage, via output $V_{OP}$, so that the source-gate voltage $V_{SGM20}$ increases. By increasing $V_{SGM20}$, more current $I_{SD}$ will be conducted by the transistor M20's conducting channel which will compensate for the decrease in $I_{SD}$ due to the increase in temperature. On the hand, when temperature decreases, the circuit 40 adjusts the gate voltage of transistor M20 so that the source-gate voltage $V_{SGM20}$ decreases. By decreasing $V_{SGM20}$, less current $I_{SD}$ will be conducted by the transistor's conducting channel which will compensate for the increase in $I_{SD}$ due to the decrease in temperature.

$V_{SGM20}$ and $V_{SGM58}$ may be adjusted (via $V_{OP}$) so that the currents $I_{SDM20}$ and $I_{SDM58}$ are maintained at relatively constant levels during temperature variations. Preferably, however, $V_{SGM20}$ and $V_{SGM58}$ are adjusted so that the currents $I_{SDM20}$ and $I_{SDM58}$ actually increase during temperature increases and decrease during temperature decreases. In the later scenario, $V_{SGM20}$ and $V_{SGM58}$ are simply increased or decreased slightly more than they would be in the first scenario. Increasing or decreasing the currents $I_{SDM20}$ and $I_{SDM58}$ according to the later scenario tends to compensate other transistors in the receiver 20 that have no direct temperature compensation system, such as transistor M89. For example, increasing the current $I_{SDM20}$ in response to a temperature increase tends to increase the current conducted by the uncompensated MOSFETs M89.

The adjusting circuitry 40 includes a positive temperature coefficient current generation stage 42, a current transfer and modification stage 44, and a start-up stage 48.

The current generation stage 42 is an important component of the circuit 40 because it generates a drain-source current $I_{M54}$ in a MOSFET that has a positive temperature coefficient. In other words, when temperature increases, current $I_{M54}$ increases, and when temperature decreases, current $I_{M54}$ decreases. As discussed above, the current conducted by the channel of a MOSFET normally has a negative temperature coefficient. Because current $I_{M54}$ has a positive temperature coefficient, the current transfer and modification stage 44 is able to use current $I_{M54}$ to generate the output $V_{OP}$ which compensates for temperature variations.

The current generation stage 42 includes an n-channel transistor M54, a monitoring circuit 80, and a current generator 82. In general, the positive temperature coefficient current $I_{M54}$ is generated as follows: The current generator 82 generates and maintains two substantially equal currents $I_{M54}$ and $I_{M56}$ that are provided to the drain of transistor M54 and the monitoring circuit 80, respectively. When the strength of one of these currents changes, the current generator 82 changes the strength of the other current so that the two currents $I_{M54}$ and $I_{M56}$ remain substantially equal. The monitoring circuit 80 monitors the potential difference between the gate and source of transistor M54 and increases the strength of current $I_{M56}$ in response to an increase in temperature, and decreases the strength of $I_{M56}$ in response to a decrease in temperature. Whether current $I_{M56}$ is increased or decreased by the monitoring circuit 80, the current generator 82 adjusts current $I_{M54}$ so that the two currents remain substantially equal. Thus, current $I_{M54}$ increases when temperature increases and decreases when temperature decreases.

The monitoring circuit 80 includes an n-channel transistor M56 which has its gate coupled to the gate of transistor M54. A resistor R30 is coupled between a first node that is common with the source of transistor M54 and a second node that is common with the source of transistor M56. In the embodiment shown in FIG. 5, the first node is ground.

As indicated in FIG. 5, transistor M56 has a larger current conducting channel than the current conducting channel of transistor M54. Preferably, the channel of transistor M56 has a width of 120 µm (micro-meters) and a length of 2 µm, and the channel of transistor M54 has a width of 40 µm and a length of 2 µm. As will be discussed below, the smaller channel size of transistor M54 results in $V_{GSM54}$ being larger than $V_{GSM56}$ when the channels of transistors M54 and M56 conduct equal currents.

The current generator 82 includes two p-channel transistors M50 and M51 that have their gates coupled together. Transistor M50 has its drain coupled to the drain of transistor M54. Transistor M51 has its drain coupled to its gate and to the drain of transistor M56. The sources of transistors M50 and M51 are coupled to a common node so that the transistors function as a current mirror. In the embodiment shown in FIG. 5, the common node is a supply voltage $V_{DD}$.

AS indicated in FIG. 5, transistors M50 and M51 have current conducting channels that are substantially the same size. Preferably, the channels of transistors M50 and M51 have widths of 80 µm and lengths of 2 µm. Furthermore, current $I_{M54}$ flows from the drain of transistor M50, and current $I_{M56}$ flows from the drain of transistor M51.

During operation, the equal currents $I_{M54}$ and $I_{M56}$ generated by the current generator 82 force the currents through transistors M54 and M56 to be substantially equal. Because transistor M54 has a higher current density than transistor M56 (due to transistor M54 having a smaller conducting channel), the $V_{GS}$ of transistor M54, i.e., $V_{GSM54}$, is larger than the $V_{GS}$ of transistor M56, i.e., $V_{GSM56}$.

The drain-source current $I_{DS}$ of a MOSFET is equal to:

$$I_{DS} = \mu Co \frac{W}{L} (V_{GS} - V_{TH})^2$$

where,

W=conducting channel width;
L=conducting channel length;
$V_{TH}$=threshold voltage;

$$\mu(T) \alpha \frac{1}{T^{1.5}};$$

and

T=temperature

From this equation it follows that, if the $I_{DS}$ of a MOSFET is held constant, then $V_{GS}$ will increase when temperature increases, and vice versa. Thus, because the current generator 82 maintains both current $I_{M54}$ and current $I_{M56}$ at a relatively constant level, voltages $V_{GSM54}$ and $V_{GSM56}$ will both increase when temperature increases and both decrease when temperature decreases. Furthermore, because transistor M54 has a higher current density than transistor M56, voltage $V_{GSM54}$ will increase or decrease more than voltage $V_{GSM56}$.

The current through resistor R30 is equal to:

$$I_{R30} = (V_{GSM54} - V_{GSM56})/R30$$

Furthermore, $$I_{R30} = I_{M56}$$

As temperature increases, voltages $V_{GSM54}$ and $V_{GSM56}$ both increase with voltage $V_{GSM54}$ increasing more than voltage $V_{GSM56}$. Thus, the difference between voltages $V_{GSM54}$ and $V_{GSM56}$ increases as temperature increases which causes current $I_{R30}$, and thus, current $I_{M56}$, to increase. Because transistors M50 and M51 are connected to operate as a current mirror, current $I_{M54}$ remains substantially equal to current $I_{M56}$. Therefore, as current $I_{M56}$ increases with increasing temperature, current $I_{M54}$ also increases. Conversely, as current $I_{M56}$ decreases with decreasing temperature, current $I_{M54}$ also decreases.

Briefly summarizing, the drain-source current $I_{DS}$ of a MOSFET normally has a negative temperature coefficient, i.e., as temperature increases, current $I_{DS}$ decreases. However, the drain-source current $I_{M54}$ of transistor M54 has a positive temperature coefficient, i.e., as temperature increases, current $I_{M54}$ increases. This phenomenon that occurs in the current generation stage 42 permits the other components of the circuit 40 to provide an output $V_{OP}$ to adjust the gate voltage of MOSFETs in order to compensate for variations in temperature.

It should also be noted that the positive temperature coefficient current generation stage 42 is normally not affected by variations in $V_{DD}$. Specifically, transistors M50 and M51 operate in the saturation range while conducting currents $I_{M54}$ and $I_{M56}$. If the supply voltage $V_{DD}$ changes, then the source-drain voltages $V_{SD}$ of each transistor M50 and M51 also change because the drains of transistors M54 and M56 are very high impedance. However, the currents $I_{M54}$ and $I_{M56}$ do not change because the transistors M50 and M51 are operating in saturation. Therefore, current $I_{M54}$, which has a positive temperature coefficient, is not affected by variations in $V_{DD}$, and, as will be seen, the source-drain currents conducted by transistors M20 and M58 in the receiver 20 are also not affected by variations in $V_{DD}$.

It is envisioned that the n-channel transistors M54 and M56 could be replaced with p-channel transistors, and that the p-channel current generating transistors M50 and M51 could be replaced with n-channel transistors. In this scenario, p-channel transistors M54 and M56 would have different size conducting channels and have their sources coupled to $V_{DD}$, and n-channel transistors M50 and M51 would have equal size conducting channels and have their sources coupled to ground.

An n-channel transistor M57, which is optional, is used to filter out noise that may be present on the ground line. Transistor M57 is capacitor connected between ground and the gates of transistors M54 and M56, i.e., transistor M57 has its source and drain coupled to ground and its gate coupled to the gates of transistors M54 and M56.

Noise that is present on the ground line will reach the sources of transistors M54 and M56 via their connections to ground. Capacitor connected transistor M57 will let noise pass to the gates of transistors M54 and M56. Because the noise is present at both the gate and source of transistors M54 and M56, the $V_{GS}$ of each transistor should remain relatively constant.

The current transfer and modification stage 44 generates a current $I_{M68}$ that is linear proportional to current $I_{M54}$. Thus, current $I_{M68}$ also has a positive temperature coefficient. Current $I_{M68}$ is used to generate $V_{OP}$.

The current transfer and modification stage 44 includes an n-channel transistor M62 having its gate coupled to the gate of transistor M54 and its source coupled to a node that is common with the source of transistor M54. In the embodiment shown in FIG. 5, the common node is ground. The drain of transistor M62 is coupled to the drain of a p-channel transistor M68 that has its gate coupled to its drain. The source of transistor M68 is coupled to voltage supply $V_{DD}$. The conducting channels of transistor M68 and M62 conduct current $I_{M68}$.

During operation, voltage $V_{GSM62}$ is equal to voltage $V_{GSM54}$ because transistors M62 and M54 form a current mirror. In the embodiment shown in FIG. 5, transistor M62 has a current conducting channel that is the same size as transistor M54's channel, i.e., width=40 µm and length=2 µm. Because these channels are the same size, current $I_{M68}$ is approximately equal to current $I_{M54}$, and therefore, current $I_{M54}$ is "transferred" to current $I_{M68}$.

It should be understood, however, that by adjusting the size of transistor M62's conducting channel, current $I_{M68}$ can be made equal to a fraction or a multiple of current $I_{M54}$. Thus, current $I_{M54}$ may be "modified" by adjusting the channel size of transistor M62.

Using the mirror effect and adjusting the channel size of transistor M62 may seem like a complex way to modify current $I_{M54}$ because it can also be modified by adjusting the value of resistor R30. However, the temperature coefficient of current $I_{M56}$ varies with its current level which is a function of the value of R30 and the channel width and length of transistors M54 and M56. Therefore, it is not desirable to adjust current $I_{M54}$ by varying R30 because such variation will also change current $I_{M54}$'s temperature coefficient.

The gate of transistor M68 is used as the output $V_{OP}$. When coupled to the gates of transistors M20 and M58, $V_{OP}$ will adjust their gate voltages in order compensate for variations in temperature. Temperature compensation is achieved because current $I_{M68}$ has a positive temperature coefficient due to the current mirror relationship between transistors M54 and M62. Because the sources of transistors M20 and M58 are coupled to $V_{DD}$, current mirrors are formed between transistors M20 and M58 and transistor M68, i.e., $V_{SG}$ of transistors M20 and M58 and transistor M68 are equal. If transistors M20 and M58 had channel sizes equal to that of M68, i.e., width=20 μm and length=1 μm, then the current conducted by transistors M20 and M58 would be equal to current $I_{M68}$ and have positive temperature coefficients. As shown in FIG. 4, however, the channel sizes of transistors M20 and M58 are not equal to that of transistor M68. It should be understood that by varying the channel sizes of transistors M20, M58, and/or M68, current IM68 and/or the channel current of the transistors M20 and M58 may be amplified. By amplifying current $I_{M68}$ in this manner, current $I_{M54}$ is "modified". However, the currents will still be linear proportional to current $I_{M54}$, and thus, will still have a positive temperature coefficient.

The transfer and modification stage 44 also includes an optional capacitor connected p-channel transistor M59 that is coupled between $V_{DD}$ and the gate of transistor M68 in order to filter out noise that may be present in the $V_{DD}$ line. Specifically, transistor M59's source and drain are coupled to $V_{DD}$ and its gate is coupled to the gate of transistor M68.

The purpose of the start-up stage 48 is to feed current to transistor M54 when the voltage supply $V_{DD}$ initially starts from ground level so that transistor M54's conducting channel can begin to conduct current.

An n-channel transistor M94 has its drain coupled to $V_{DD}$ and its source coupled to the drain of transistor M54. A diode connected p-channel transistor M92 is coupled between $V_{DD}$ and the gate of transistor M94, and two diode connected n-channel transistors M96 and M98 couple the gate of transistor M94 to ground. In the embodiment shown in FIG. 6, transistor M94 has a channel width=5 μm and a channel length=2 μm, transistor M92 has a channel width=3 μm and a channel length=100 μm, and transistors M96 and M98 have channel widths=60 μm and channel lengths=2 μm. The channel sizes of transistors M92, M94, M96, and M98 may be varied to suit the needs of a particular application.

When voltage supply $V_{DD}$ initially starts from ground level, none of the transistors carry current. When $V_{DD}$ rises above three times the threshold voltage, i.e., 3 $V_{TH}$, of transistor M94, transistor M94 feeds current into the drain of transistor M54. As the channel of transistor M54 begins to conduct current, a voltage drop is induced across the gate and source of transistor M56. Transistor M56 begins to conduct current which causes transistor M51 to begin to conduct current. Due to the current mirror action, transistor M50 also begins to conduct current which feeds back to transistor M54. This positive feedback continues until the current conducted by transistor M56 reaches its final value. Because the gate of transistor M94 is clamped by diode connected transistors M96 and M98, the rise of the drain potential of transistor M54 eventually shuts off transistor M94.

It should be well understood that the specific channel sizes of the MOSFETs shown in FIGS. 4 and 5 and recited herein may be adjusted to achieve various different amplifications of the generated currents and voltages without deviating from the spirit of the present invention.

The rise time $t_r$, fall time $t_f$, edge rate, turn-on delay, turn-off delay, and propagation delay of the prior art receiver 10 discussed above are sensitive to temperature and voltage supply $V_{DD}$ variations because the current levels conducted by its transistors vary with such temperature and supply variations. The levels of current conducted by its transistors directly relate to the rise time $t_r$, fall time $t_f$, etc., of the receiver 10. However, the temperature compensation circuit 40 of the present invention causes the currents conducted by transistors M20 and M58 of the receiver 20 to be compensated for such temperature variations. Furthermore, as discussed above, the temperature compensation circuit 40 also causes the currents conducted by transistors M20 and M58 to not be affected by variations in $V_{DD}$. Thus, the rise time $t_r$, fall time $t_f$, edge rate, turn-on delay, turn-off delay, and propagation delay of the receiver 20 are relatively insensitive to temperature and voltage supply $V_{DD}$ variations.

The temperature compensation circuit 40 also causes the rise time $t_r$, fall time $t_f$, edge rate, turn-on delay, turn-off delay, and propagation delay of the receiver 20 to be relatively insensitive to process variations because the current conducted by transistors M20 and M58 is set, and can be adjusted by, the temperature compensation circuit 40.

Because the improvements in the rise time $t_r$, fall time $t_f$, edge rate, turn-on delay, turn-off delay, and propagation delay due to the temperature compensation circuit 40 and the symmetrical charging and discharging currents provided by transistor M20, the driver 30 has low output pulse distortion and may be operated at a data rate up to 250 MHz.

Figure 6:
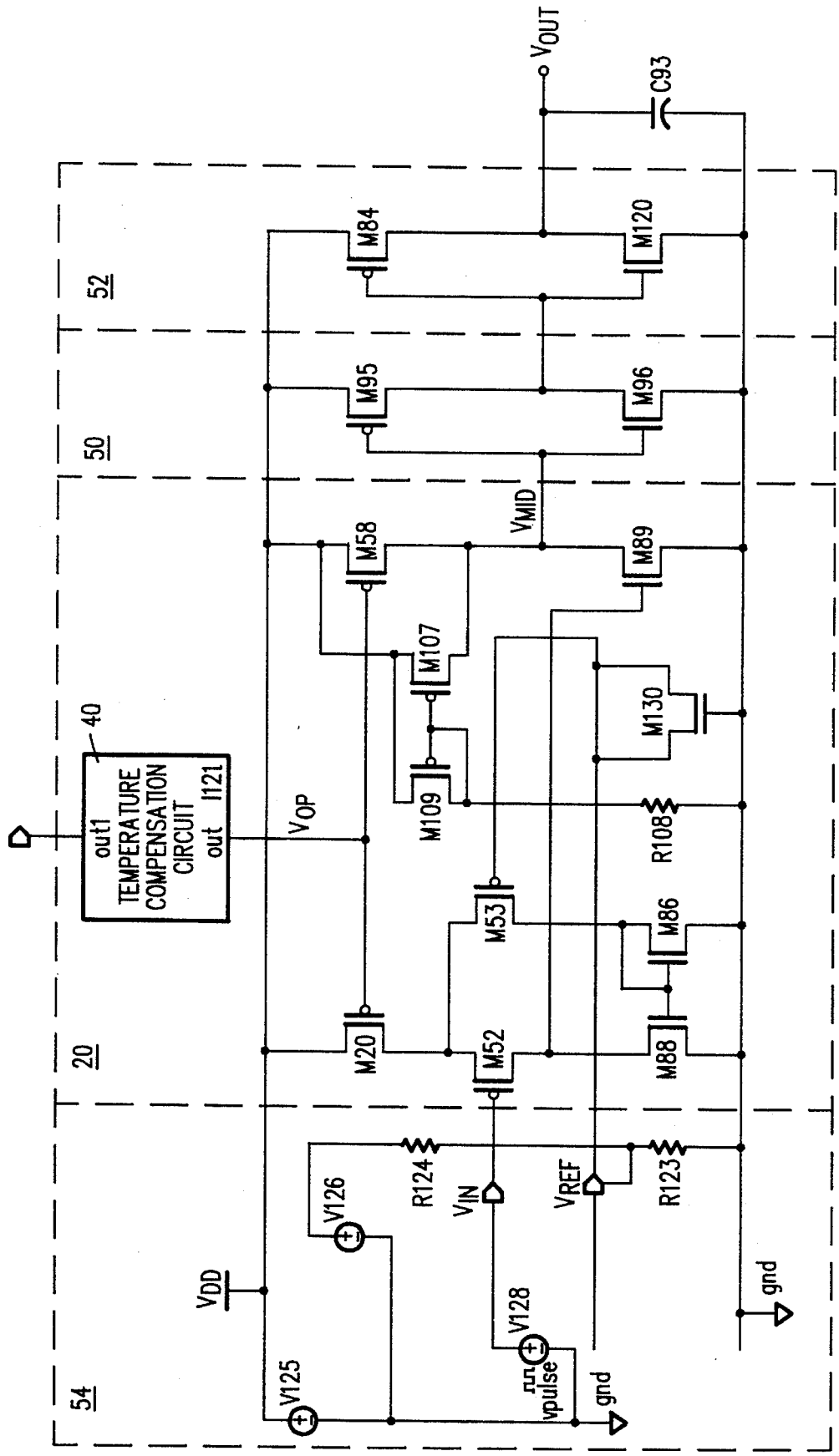
FIG. 6 is a schematic diagram illustrating a CMOS transmission line receiver in accordance with the present invention with output inverters.

FIG. 6 shows the receiver 20 with two CMOS inverters 50 and 52 coupled to $V_{MID}$. The inverters 50 and 52 provide additional wave shaping to $V_{MID}$ to produce $V_{OUT}$. Inverter 50 includes a p-channel transistor M95 and an n-channel transistor M96, and inverter 52 includes a p-channel transistor M84 and an n-channel transistor M120. Biasing circuitry 54 is also coupled to the receiver 20. This circuitry 54 provides the reference voltage $V_{REF}$.

The receiver 20 includes an optional capacitor connected n-channel transistor M130 that is coupled between $V_{REF}$ and the node that is common with the sources of transistors M88 and M86 in order to filter out noise that may be present in the line that is common with the sources of transistors M88 and M86.

Figure 7A:
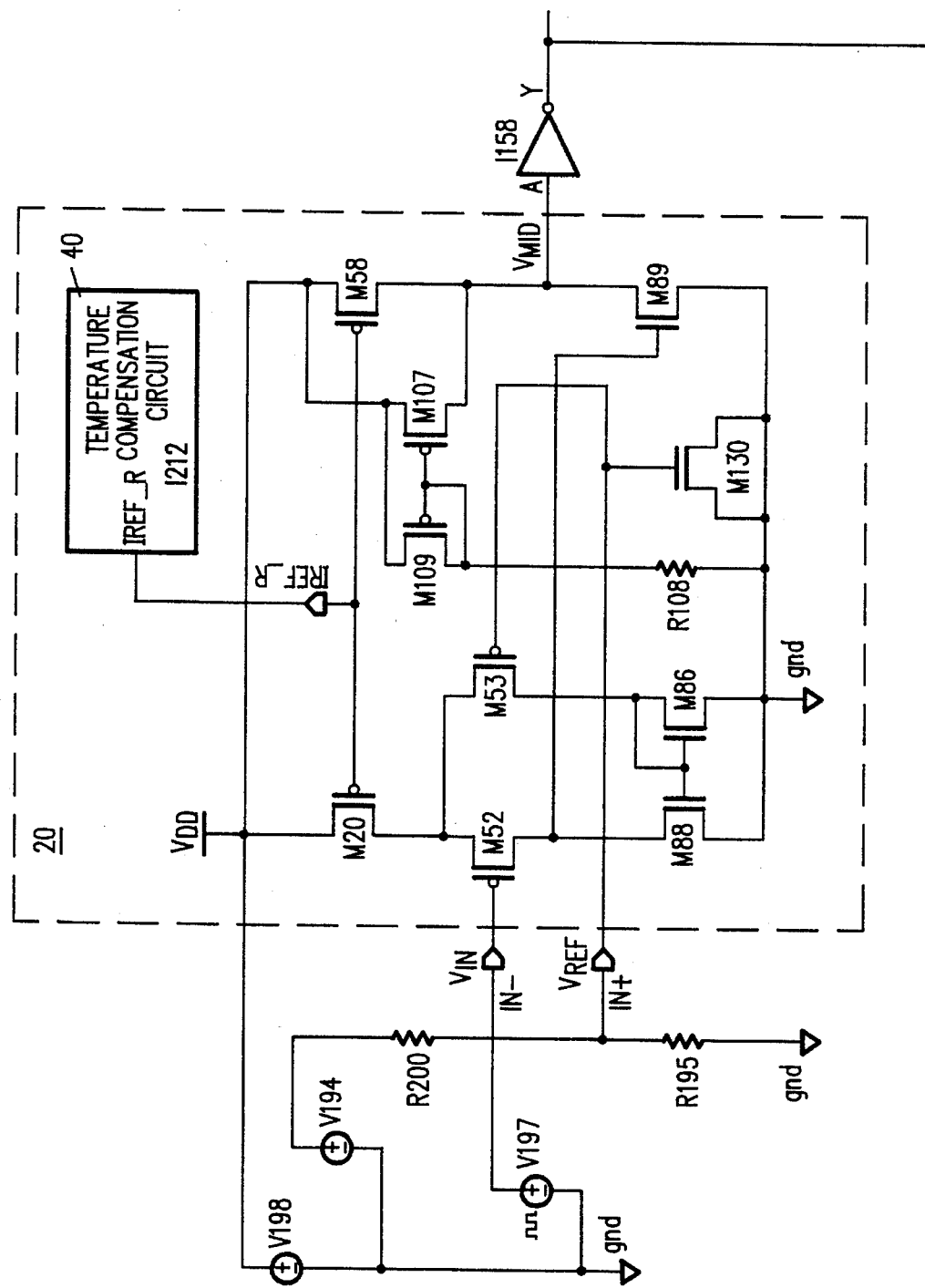
FIG. 7 is a schematic diagram illustrating a CMOS transmission line receiver in accordance with the present invention with tri-state output circuitry.
Figure 8A:
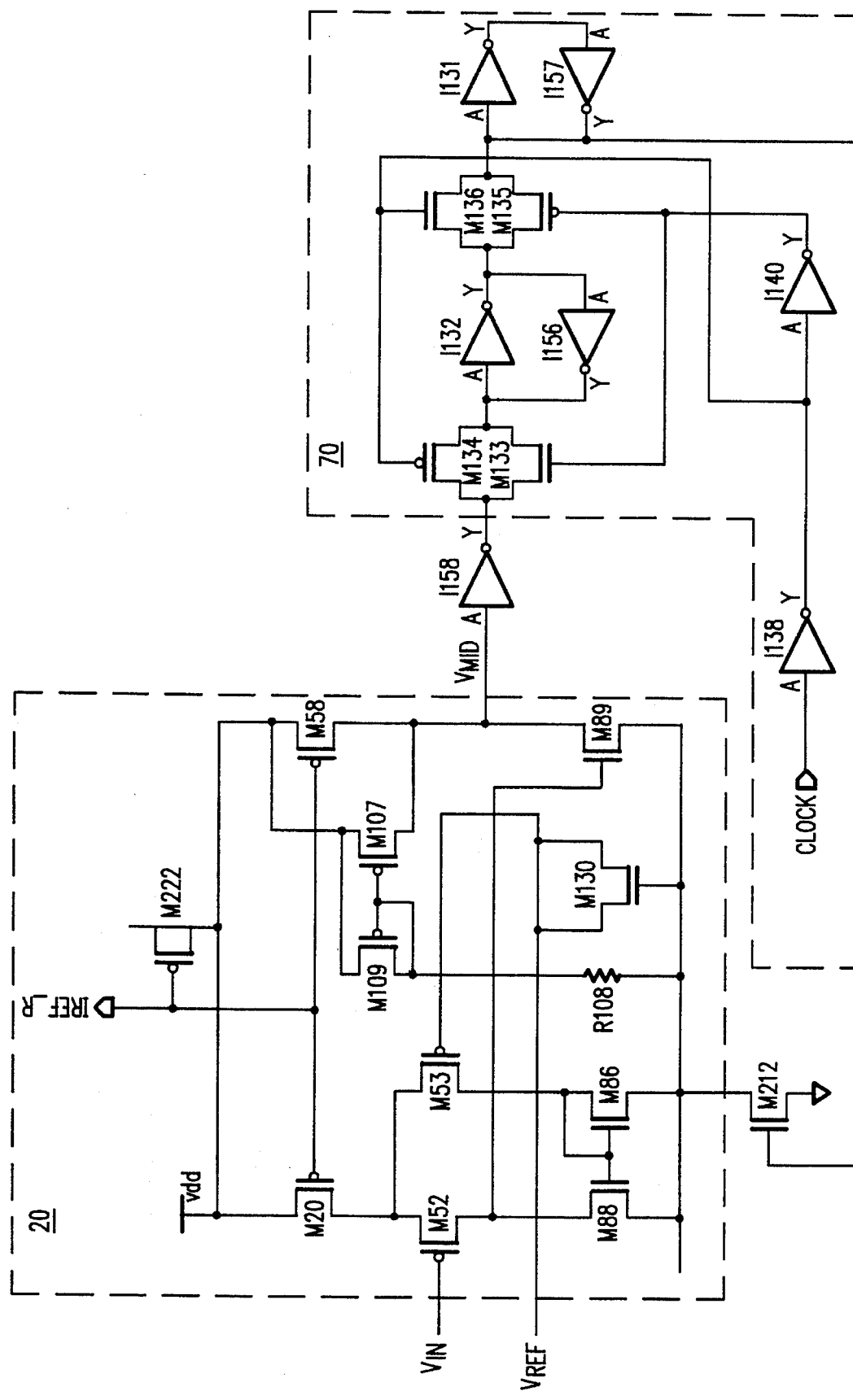
FIG. 8 is a schematic diagram illustrating a CMOS transmission line receiver in accordance with the present invention with tri-state output circuitry.

FIGS. 7 and 8 show the receiver 20 with various tri-state output circuitry 60 and 70 coupled to $V_{MID}$.

Although the embodiment of the present invention shown in FIGS. 4 through 8 utilizes MOSFETs, it is envisioned that the present invention may also be used in connection with other technologies, such as junction FETs (JFETs) or Gallium Arsenide (GaAs).

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A receiver for providing binary signals from a transmission line to a data system, the receiver comprising:

a differential comparator that compares a reference voltage to an input voltage and that provides a comparator output signal in response to the comparison, the comparator output signal indicating whether the input voltage is greater or less than the reference voltage; and a first current source coupled to the differential comparator that provides current to the differential comparator, the first current source providing substantially the same amount of current to the differential comparator whether the input voltage is greater or less than the reference voltage, the first current source having a positive temperature coefficient so that when temperature increases the current provided by the first current source increases.

2. A receiver according to claim 1, wherein the differential comparator comprises:

first and second p-channel transistors that have their sources coupled together;

first and second n-channel transistors that have their gates and sources coupled together and their drains coupled respectively to the drains of the first and second p-channel transistors; and wherein, the gate of the first p-channel transistor receives the input voltage, the gate of the second p-channel transistor receives the reference voltage, and the drain of the first n-channel transistor provides the comparator output signal.

3. A receiver according to claim 1, wherein the first current source comprises:

a third p-channel transistor having its source coupled to a first voltage supply and its drain coupled to the differential comparator; and a positive temperature coefficient current generation circuit connected to adjust the gate voltage of the third p-channel transistor to provide current to the differential comparator and to compensate for variations in temperature.

4. A receiver according to claim 3, wherein the positive temperature coefficient current generation circuit comprises:

a first field-effect transistor (FET);

a second FET having a larger current conducting channel than the current conducting channel of the first FET, the second FET having its gate coupled to the gate of the first FET;

a first resistor coupled between a first node that is common with the source of the first FET and a second node that is common with the source of the second FET; and current generating circuitry connected to generate and maintain substantially equal drain currents in the first and second FETs.

5. A receiver for providing binary signals from a transmission line to a data system, the receiver comprising:

a differential comparator that compares a reference voltage to an input voltage and that provides a comparator output signal in response to the comparison, the comparator output signal indicating whether the input voltage is greater or less than the reference voltage; and a middle stage that amplifies the comparator output signal to produce a middle stage output signal and that compensates the middle stage output signal for variations in temperature.

6. A receiver according to claim 5, wherein the differential comparator comprises:

first and second p-channel transistors that have their sources coupled together;

first and second n-channel transistors that have their gates and sources coupled together and their drains coupled respectively to the drains of the first and second p-channel transistors; and wherein, the gate of the first p-channel transistor receives the input voltage, the gate of the second p-channel transistor receives the reference voltage, and the drain of the first n-channel transistor provides the comparator output signal.

7. A receiver according to claim 5, wherein the middle stage comprises:

a third n-channel transistor that receives the comparator output signal at its gate, has its source coupled to a first node, and that produces the middle stage output signal at its drain; and a first current source that provides current to the drain of the third n-channel transistor, the first current source having a positive temperature coefficient so that when temperature increases the current provided by the first current source increases.

8. A receiver according to claim 7, wherein the first current source comprises:

a third p-channel transistor that has its source coupled to the first voltage supply and its drain coupled to the drain of the third n-channel transistor; and a positive temperature coefficient current generation circuit that adjusts the gate voltage of the third p-channel transistor to provide current to the drain of the third n-channel transistor and to compensate for variations in temperature.

9. A receiver according to claim 8, wherein the positive temperature coefficient current generation circuit comprises:

a first field-effect transistor (FET);

a second FET having a larger current conducting channel than the current conducting channel of the first FET, the second FET having its gate coupled to the gate of the first FET;

a first resistor coupled between a first node that is common with the source of the first FET and a second node that is common with the source of the second FET; and current generating circuitry connected to generate and maintain substantially equal drain currents in the first and second FETs.

10. A receiver according to claim 7, wherein the middle stage further comprises:

a second current source that provides current to the drain of the third n-channel transistor, the second current source having a negative temperature coefficient so that when temperature increases the current provided by the second current source decreases.

11. A receiver according to claim 10, wherein the second current source comprises:

a fourth p-channel transistor that has its source coupled to the first voltage supply and its drain coupled to the drain of the third n-channel transistor; and bias means for applying a voltage between the source and gate of the fourth p-channel transistor so that its channel will conduct a current that has a negative temperature coefficient.

12. A receiver according to claim 11, wherein the bias means comprises:

a fifth p-channel transistor that has its source coupled to the first voltage supply and its gate coupled to its drain and the gate of the fourth p-channel transistor; and a second resistor coupled between the drain of the fifth p-channel transistor and the first node.

13. A receiver for providing binary signals from a transmission line to a data system, the receiver comprising:

a differential comparator that compares a reference voltage to an input voltage and that provides a comparator output signal in response to the comparison, the comparator output signal indicating whether the input voltage is greater or less than the reference voltage;

a first current source coupled to the differential comparator that provides current to the differential comparator, the first current source providing substantially the same amount of current to the differential comparator whether the input voltage is greater or less than the reference voltage, the first current source having a positive temperature coefficient so that when temperature increases the current provided by the first current source increases; and a middle stage that amplifies the comparator output signal to produce a middle stage output signal and that compensates the middle stage output signal for variations in temperature.

14. A receiver according to claim 13, wherein the differential comparator comprises:

first and second p-channel transistors that have their sources coupled together;

first and second n-channel transistors that have their gates and sources coupled together and their drains coupled respectively to the drains of the first and second p-channel transistors; and wherein, the gate of the first p-channel transistor receives the input voltage, the gate of the second p-channel transistor receives the reference voltage, and the drain of the first n-channel transistor provides the comparator output signal.

15. A receiver according to claim 13, wherein the middle stage comprises:

a third n-channel transistor that receives the comparator output signal at its gate, has its source coupled to a first node, and that produces the middle stage output signal at its drain; and a second current source that provides current to the drain of the third n-channel transistor, the second current source having a positive temperature coefficient so that when temperature increases the current provided by the second current source increases.

16. A receiver according to claim 15, wherein the first and second current sources comprise:

a third p-channel transistor having its source coupled to a first voltage supply and its drain coupled to the differential comparator;

a fourth p-channel transistor that has its source coupled to the first voltage supply and its drain coupled to the drain of the third n-channel transistor; and a positive temperature coefficient current generation circuit that adjusts the gate voltages of the third and fourth p-channel transistors to provide current to the differential comparator and the drain of the third n-channel transistor and to compensate for variations in temperature.

17. A receiver according to claim 15, wherein the middle stage further comprises:

a third current source that provides current to the drain of the third n-channel transistor, the third current source having a negative temperature coefficient so that when temperature increases the current provided by the third current source decreases.

18. A receiver according to claim 17, wherein the third current source comprises:

a fifth p-channel transistor that has its source coupled to the first voltage supply and its drain coupled to the drain of the third n-channel transistor; and bias means for applying a voltage between the source and gate of the fifth p-channel transistor so that its channel will conduct a current that has a negative temperature coefficient.

19. A receiver according to claim 18, wherein the bias means comprises:

a sixth p-channel transistor that has its source coupled to the first voltage supply and its gate coupled to its drain and the gate of the fifth p-channel transistor; and a second resistor coupled between the drain of the sixth p-channel transistor and the first node.

* * * * *